(12) United States Patent
Ki et al.

(10) Patent No.: US 10,461,775 B2
(45) Date of Patent: *Oct. 29, 2019

(54) COMPRESSION AWARE SSD

(71) Applicant: Samsung Electronics Co., Ltd., Suwon-si, Gyeonggi-do (KR)

(72) Inventors: Yang Seok Ki, Palo Alto, CA (US); Yongsuk Lee, Cupertino, CA (US); Jason Martineau, Milpitas, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/111,112

(22) Filed: Aug. 23, 2018

(65) Prior Publication Data

US 2019/0007058 A1  Jan. 3, 2019

Related U.S. Application Data

(63) Continuation of application No. 15/688,779, filed on Aug. 28, 2017, now Pat. No. 10,097,202.

(60) Provisional application No. 62/522,423, filed on Jun. 20, 2017.

(51) Int. Cl.
*H03M 7/30* (2006.01)
*H03M 7/48* (2006.01)
*G11B 20/00* (2006.01)
*G11B 20/18* (2006.01)

(52) U.S. Cl.
CPC ..... *H03M 7/3088* (2013.01); *G11B 20/00007* (2013.01); *H03M 7/30* (2013.01); *H03M 7/48* (2013.01); *H03M 7/6064* (2013.01); *G11B 20/18* (2013.01); *G11B 2020/00079* (2013.01); *H03M 7/3097* (2013.01)

(58) Field of Classification Search
CPC .... H03M 7/3088; H03M 7/48; H03M 7/3097; H03M 7/30; H03M 7/3071; H03M 7/3079; G11B 20/18
USPC ...................... 341/51, 87, 106; 711/161–162
See application file for complete search history.

(56) References Cited

U.S. PATENT DOCUMENTS

| | | | | |
|---|---|---|---|---|
| 4,558,302 A | * | 12/1985 | Welch ................ | H03M 7/3088 341/51 |
| 5,467,087 A | * | 11/1995 | Chu .................... | H03M 7/3086 341/51 |
| 7,190,284 B1 | | 3/2007 | Dye et al. | |
| 8,462,027 B2 | | 6/2013 | Litvak | |

(Continued)

*Primary Examiner* — Khai M Nguyen
(74) *Attorney, Agent, or Firm* — Lewis Roca Rothberger Christie LLP

(57) ABSTRACT

Embodiments of the present invention include a compression system including one or more compressibility inputs; a compression predictor configured to predict the compressibility of data based on the one or more compressibility inputs; a compressor configured to compress the data; and one or more compression inputs. At least one of the compression predictor or the compressor is configured to determine how to compress the data based on the one or more compression inputs. The one or more compressibility inputs comprise at least one of an object extension dictionary, an object signature dictionary, and an entropy estimation algorithm library. The one or more compression inputs comprise at least one of a quality of service profile, a device performance profile and a compression algorithm performance chart.

20 Claims, 3 Drawing Sheets

(56) References Cited

U.S. PATENT DOCUMENTS

| | | | |
|---|---|---|---|
| 8,527,467 B2* | 9/2013 | Shmueli | G06F 16/185 |
| | | | 707/651 |
| 8,659,452 B2* | 2/2014 | Cho | H03M 7/30 |
| | | | 341/107 |
| 8,996,787 B2 | 3/2015 | Kettner | |
| 9,048,862 B2* | 6/2015 | Condict | H03M 7/607 |
| 9,246,511 B2* | 1/2016 | Kipnis | H03M 7/30 |
| 9,355,112 B1 | 5/2016 | Armangau et al. | |
| 9,575,982 B1 | 2/2017 | Sankara Subramanian et al. | |
| 9,606,750 B2* | 3/2017 | Seo | G06F 3/0608 |
| 10,097,202 B1* | 10/2018 | Ki | H03M 7/3088 |
| 2006/0193470 A1 | 8/2006 | Williams | |
| 2010/0011012 A1 | 1/2010 | Rawson | |
| 2012/0030408 A1 | 2/2012 | Flynn et al. | |
| 2013/0191649 A1 | 7/2013 | Muff et al. | |
| 2014/0215170 A1* | 7/2014 | Scarpino | G06F 3/0608 |
| | | | 711/161 |
| 2014/0244604 A1* | 8/2014 | Oltean | H03M 7/3091 |
| | | | 707/693 |
| 2014/0281146 A1 | 9/2014 | Horn | |
| 2016/0371190 A1 | 12/2016 | Romanovskiy | |

\* cited by examiner

COMPRESSION AWARE SSD

CROSS-REFERENCE TO RELATED APPLICATION(S)

This application is a continuation of U.S. patent application Ser. No. 15/688,779, filed Aug. 28, 2017, which claims the benefit of U.S. Provisional Patent Application Ser. No. 62/522,423, filed Jun. 20, 2017, the entire contents of both of which are incorporated herein by reference.

BACKGROUND

Compressing data is a useful way to increase the effective use of data storage capacity. However, not all compression algorithms are equal. Some compression algorithms work better with certain types of data than others and, in general, compression algorithms trade compression ratio for time/processing effort.

If a storage device naively attempts to compress all data it receives and stores, it will cause unnecessary latency, degradation in throughput, and wasted processor cycles. This is because not all incoming data is easily amenable to compression. Some data is already compressed on the host, either as part of a separate, explicit compression feature, or inherently, as is the case of many multimedia file types. These files are not easily amenable to additional compression, causing throughput degradation and latency. Such degradation may be acceptable if the average compression ratio is good (i.e., there is a substantial reduction in space usage). However, if the average compression ratio is poor, the purpose of the data compression will not be achieved and the only result will be performance loss.

Conventional block storage systems, which store files in logical blocks of the same size, are capable of compressing individual logical blocks to increase storage capacity. However, the storage structure of block systems makes it difficult to improve compression of the stored data based on the file type and format, because it is difficult to locate individual files of a particular type or format in and among the blocks. Each logical block in a block storage system may contain several different files (or parts of several files), or conversely, a single data file may be dispersed among several logical blocks, making it difficult to isolate particular file types for individual and targeted compression with algorithms best suited to compress that particular type of data. In addition, logical blocks do not necessarily contain information regarding the start and end points of each individual data file or information regarding input data format.

Similarly, important metadata about the identity of a file occupying one or more blocks may be absent from that particular block level. Thus, traditional block systems would need to sample the data of any block and perform complex mathematical computations to measure potential compressibility of the block. This causes additional performance losses. In addition, compressing information on a block based drive requires substantial background activities to track the location of each block of a target file, compress and assemble those into new blocks, then update mapping tables to show the new locations of compressed and stored information, which may have been substantially changed in the compressing process.

Key value storage systems differ from conventional block storage systems in that they don't contain logical blocks of the same size, but instead store data as values of variable size in which the value represents a particular piece of data or file. Key value storage uses keys that point to specific values stored within. The key may contain useful information, including a logical address, a hash value derived from the data, the data format, etc., regarding the data stored.

An improved compression drive is needed that takes advantage of the organization of key value storage systems in order to allow for variable compression that improves overall storage compression. For example, a drive is needed that is capable of determining if a good compression ratio is expected prior to compression, avoiding useless compression and performance loss. In addition, a drive is needed that is capable of not just performing compression on host data, but of also determining when and how to best compress this data (if at all) based on the nature of the data, the drive capabilities, and/or end user Quality of Service (QoS) requirements.

The above information disclosed in this Background section is only for enhancement of understanding of the background of the disclosure and therefore it may contain information that does not constitute prior art.

SUMMARY

Embodiments of the present invention include a compression system having a compression predictor for predicting the compressibility of data and a compressor for compressing data based on the prediction, a drive including the compression system, and methods for predicting and compressing data.

For example, embodiments of the present invention include a compression system including one or more compressibility inputs, a compression predictor configured to predict the compressibility of data based on the one or more compressibility inputs, a compressor configured to compress the data; and one or more compression inputs. At least one of the compression predictor or the compressor is configured to determine how to compress the data based on the one or more compression inputs. The one or more compressibility inputs include at least one of an object extension dictionary, an object signature dictionary, and an entropy estimation algorithm library. The one or more compression inputs include at least one of a quality of service profile, a device performance profile and a compression algorithm performance chart.

Further embodiments include a storage drive that includes the compression system.

In addition, embodiments include a method of compressing data on a storage drive, where the method includes predicting the compressibility of data on the drive based on one or more compressibility inputs, determining how to compress the data based on the one or more compression inputs and compressing the data based on the determination of how to compress the data. The one or more compressibility inputs include at least one of an object extension dictionary, an object signature dictionary, and an entropy estimation algorithm library. The one or more compression inputs include at least one of a quality of service profile, a device performance profile and a compression algorithm performance chart.

BRIEF DESCRIPTION OF THE DRAWINGS

Further features and aspects will become apparent and will be best understood by reference to the following detailed description reviewed in conjunction with the drawings. In the drawings.

DETAILED DESCRIPTION

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Embodiments of the present invention are directed to a solid state drive with improved compressibility. Initially, characteristics of files stored on the drive are analyzed to predict the extent to which each file is capable of being compressed (i.e., the compressibility of the file). Once a prediction is made regarding compressibility, a decision will be made regarding whether or not to compress the data. This decision can be based on the predicted compressibility of the data, as well as other factors, such as Quality of Service (QoS) demands and present device capabilities. If a decision is made to compress, a determination is then made regarding how to compress the data, taking into consideration factors such as the characteristics of the data and device, and the QoS demands to determine which algorithm would be best to use under the current conditions, so that overall performance is optimized.

Figure 1:
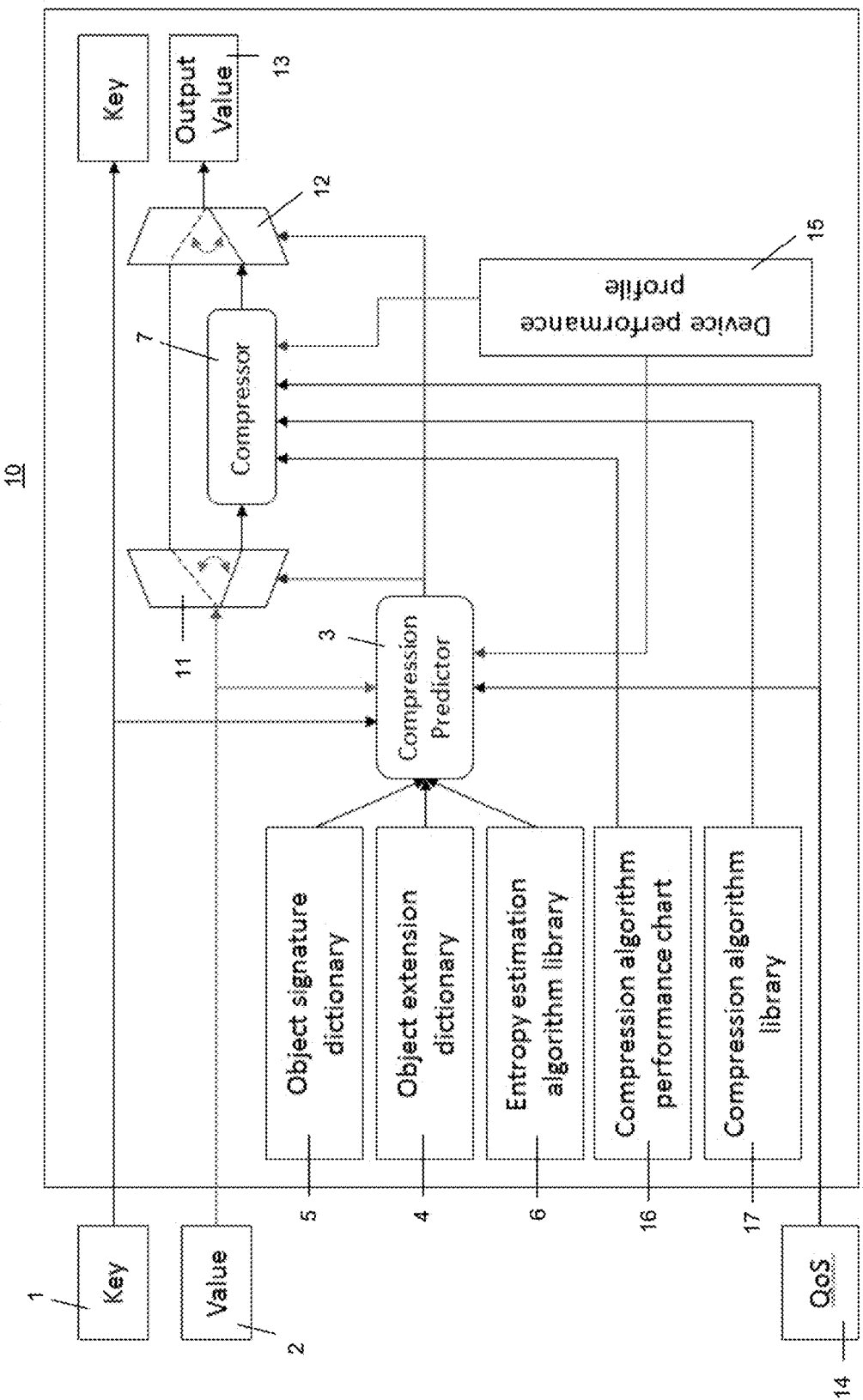
FIG. 1 is a flow chart schematically showing a compression drive according to an exemplary embodiment.

FIG. 1 is a flow chart showing the compression drive 10 according to one embodiment. The drive 10 in this embodiment is a key value storage drive, in order to leverage the readily accessible information stored in the keys and values of the data stored on the drive 10. The flow chart of FIG. 1 shows an exemplary data set of drive 10 including a key 1 and a value 2. Information contained in the key 1 and value 2 may be analyzed by a compression predictor 3 to determine the compressibility of the value 2. The compression predictor 3 may use information contained in an object extension dictionary 4, an object signature dictionary 5, and/or an entropy estimation algorithm library 6 to determine or aid in determining the compressibility of the value 2.

The object extension directory 4 contains a list of known object extensions (i.e., file extensions), with an evaluation of how compressible those types of objects are for each of a variety of compression techniques. This information is provided by the object extension directory 4 to the compression predictor 3 to facilitate compression prediction, and may result in some forms of compressibility prediction being done without directly sampling significant amounts of data contained in the value 2. For example, the key 1 may contain the file extension, indicating that the data file is a PPTX, PDF, MP3, JPG, etc., which may provide clues regarding the compressibility of the file. If the key 1 indicates that the file contains an MP3 file, which is already inherently compressed, the drive 10 can know without sampling any data from the value 2 that the value 2 is unlikely to be further compressed. On the other hand, if the key 1 indicates that it stores a black- and white bitmap (BMP) image, then the drive 10 would know without sampling the value 2 that the value 2 would be a good candidate for compression.

The key 1 may contain other clues regarding compressibility, including the file signature (i.e., the object signature). The file signature is a line of code that provides information regarding the type of file that is stored in the value 2. A list of known signatures for data types and an evaluation of how compressible they are can be maintained in the object signature dictionary 5. Thus, if the file extension is not included in the key 1, the file signature may be, and may provide information regarding the type of file stored in the value 2. Information from the object signature dictionary 5 is provided to the compression predictor 3 to facilitate compression prediction.

While the file extension and file signature are used as examples in this embodiment to show the type of metadata stored in the key 1 that may help predict compressibility, other metadata may be included that may be used in addition to or instead of the file extension and/or the file signature to predict compressibility. Information correlating this other metadata to file types and compression effectiveness can be stored in dictionaries and made available to the compression predictor.

If the key 1 does not contain metadata hints, it may be necessary to sample the data contained in the value 2. However, because the drive 10 is a key value drive, the start and end of a data set is easily located as compared to conventional block-based drives. This means two things: first, that any sample taken is guaranteed to come only from the data of interest, making any compression prediction more accurate. Second, knowing the start of the data allows easily location of the header of the value 2, which can contain clues (e.g., metadata or signatures not in the key 1) that could be used to predict compression performance without requiring further sampling of the value 2 and without requiring more complex calculations.

If the file extension and/or file signature is not included in the key 1, it may be included in the header or at a specific known location within the value 2. For example, some file signatures are located at specific offsets from the beginning of a file. Table 1 below is a list of several common file types, and their associated signatures and offsets:

TABLE 1

| Type | Description | Signature | Offset | Size |
|---|---|---|---|---|
| GIF | GIF File | 47 49 46 38 | 0 | 4 |
| JPG | JPEG Image | FF D8 FF E0 | 0 | 4 |
|  | Cannon EOS | FF D8 FF E2 | 0 | 4 |
|  | Samsung D500 | FF D8 FF E3 | 0 | 4 |
| MPG | DVD Video | 00 00 01 BA | 0 | 4 |
|  | MPEG Video | 00 00 01 B3 | 0 | 4 |
| MP3 | MPEG Audio | 49 44 33 | 0 | 3 |
| ZIP | PKZIP archive_1 | 50 4B 03 04 | 0 | 4 |
|  | PKLITE archive | 50 4B 4C 49 54 45 | 30 | 6 |
|  | WinZip | 57 69 6E 5A 69 70 | 29152 | 6 |

As shown in Table 1, many file types are located at an offset of 0, i.e., at the beginning of the file header, making sampling of the value 2 to find the file signature relatively easy. Even if the file signature isn't at the beginning of the header, specific offsets can be sampled to search for the signatures of commonly used file types. Therefore, if the key 1 does not contain information regarding the file type, specific locations within the value 2 can be sampled in order to quickly and efficiently search for the file signature.

While the file signature is used as an example in this embodiment to show the types of metadata that may be stored in the header that may help predict compressibility, other metadata may be included in the header or at predictable offsets within the value that may be used in addition to or instead of the file signature to predict compressibility. For example, the header may include other metadata that indicates what the file format of the value is. Information correlating other metadata with file types and compression performance can be stored in dictionaries and made available to the compression predictor.

If metadata relevant to compression is both not in the key 1 and not in a sampled file header and offset locations, a mathematically more complex compressibility algorithm (e.g., an entropy calculation based measurement) may be needed.

An entropy estimation algorithm library 6 contains code for testing the entropy of any sampled data, and thereby determining how compressible it is. Entropy-based calculations may be used to search portions of the value 2 to predict if the file is compressible. Entropy-based calculations function on the principle that entropic or random data is harder to compress. Generally, files which have already been compressed have higher entropic characteristics. An uncompressed file is more likely to have ordered data that is easier to compress. For example, a compression algorithm may compress an uncompressed file including an area of repeated code having one hundred "1"s in a row to a shorter, less ordered line of code that says (in essence) you have "1"×100 in that area.

Because the start and end of a data set is known in a key value system, an entropy-based calculation can be used on a sample portion of the value to accurately predict the compressibility of the entire value. Results showing high entropy will indicate that the value is likely not compressible and results showing low entropy will indicate that the value is likely to be compressible. Information from the entropy estimation algorithm library 6 can be provided to the compression predictor 3 to aid in prediction.

In addition to or in lieu of performing entropy-based calculations on a sample of the value 2, a sample compression can be run on a portion of the value 2 to estimate compressibility. For example, a region of the value 2 (for example, a known and relatively small region) could be compressed using a test algorithm. If the space savings are beyond a certain threshold (indicating that compressibility is reasonable) then that would be a positive indication of compressibility, and the results of the test compression could be sent to a compressor 7 on the drive 10 to aid in the compression of the value 2. In some embodiments, multiple algorithms may be used on the same region of the value 2, so that compression may be better optimized. However, such an approach would consume more time and resources and the user may want to only run such a process when QoS requirements are low.

In sum, there are various locations that can be checked and analyses that can be run in a key-value device to predict compressibility, and these can be mixed and matched to provide varying degrees of accuracy, at varying speeds. Generally, the accuracy of the prediction and the speed of attaining the prediction are inversely correlated. For example, searching the key 1 and the header of the value 2 to review metadata clues regarding compressibility (e.g., from the file extension or file signature) is relatively fast compared to scanning a sample portion of the value 2 and running entropy-based calculations. However, metadata clues are theoretically much less accurate than entropy-based calculations.

In addition to the above metadata information and analyses, the compression predictor 3 can consider various other factors to predict compressibility, including QoS requirements and performance capabilities of the drive 10.

QoS requirements and information may be incorporated into a QoS profile 14. The QoS profile 14 incorporates considerations such as the user's current performance requirements and needs, so that any compression algorithm that runs will not adversely affect the performance demands of the user. QoS information may inform an onboard controller of the drive 10, where the onboard controller handles performance management tasks, of the parameters of performance it needs to maintain to be acceptable to the end user. QoS information may be used by the compression predictor 3 to determine if a predicted compression ratio meets QoS requirements. In addition, QoS information can be used to set the mechanisms by which compressibility may be predicted by the compression predictor 3. For example, QoS requirements may put limits on the throughput levels and bandwidth available for compression, and may limit the acceptable amount of latency caused by compression to a limit that does not negatively impact the user's needs. Further, a user's QoS requirements may require a certain amount of processor power to run the applications, processes, etc. being used by the user. These requirements limit the compression algorithms (and potentially decompression algorithms during recompression efforts) that may be used to algorithms that do not exceed the bandwidth, throughput, latency, processor or other requirements of the user at that time.

Performance capabilities of the drive 10 may be stored in a device performance profile 15. The device performance profile 15 tracks static and dynamic aspects of the drive's 10 performance. This information is used by the compression predictor 3 to determine if a value can be compressed enough (and if so, how) to meet the needs of the both the QoS 14 and drive 10.

Some or all of the above metadata information, entropy-based calculations, sample compressions, QoS requirements and device information can be analyzed by the compression predictor 3 to predict whether or not compressing the value 2 will result in a useful compression ratio, and/or if it would negatively impact the QoS. The final prediction may be threshold-based taking into consideration some or all of these factors. For example, in some embodiments, if the predicted compressibility is above a predetermined threshold (a threshold which may be designated and input by the user taking into consideration any or all of above-mentioned factors relevant to predicting compressibility), then the compression predictor 3 will determine that compression should go forward. If the predicted compressibility is below the predetermined threshold, then the compression predictor 3 will determine that value 2 should not be compressed. In other embodiments, the decision may be the result of multiple threshold checkpoints. For example, different factors, such as QoS requirements, entropy-based calculations, sample compressions, etc. may have a different threshold or several thresholds which will be considered in order to determine whether compression should go forward. If any one of these thresholds, or in some embodiments any combination of these thresholds, is not met, then compression will not go forward. Information regarding these thresholds can be maintained in a decision table. The decision table would include factors like the above factors, in addition to factors such as a predicted compression ratio, current system performance characteristics, and various QoS requirements, discussed in greater detail below. An analysis of these various factors can be used to determine if compressibility should proceed.

Ultimately, whatever the predictive method, a prediction will be made as to how compressible a value may be. This decision may be based on a threshold or thresholds, such as speed or compressibility thresholds, the decision table, or the like.

Once a determination is made by the compression predictor 3 as to whether or not to compress the value 2, this result is provided to a receiving switch 11. The receiving switch 11 receives the value 2 and, based on the result from the compression predictor 3, switches between outputting the value 2 to the compressor 7 or circumventing the compressor 7 and sending the value 2 straight to an exit switch 12 for output 13. Therefore, if the compression predictor 3 determines that compression should occur, the receiving switch 11 will send the value 2 to the compressor 7 and if the compression predictor 3 determines that compression should not occur, the receiving switch 11 will send the value 2 to the exit switch 12 for output 13.

If the value 2 is found to warrant compression and is sent to the compressor 7, the compressor 7 will then determine how to compress the drive 10. Alternatively, the compression predictor 3 may determine how to compress the drive 10 prior to sending the value 2 to the compressor 7. Determining how to compress a file may require taking into consideration various factors, as not all compression algorithms are equal. Some algorithms work to compress some forms of data better than others, some algorithms require more processor or memory capability than others, some have greater throughput than others, and some provide, overall, better compression ratios than others. In determining how to compress the value 2, the compressor 7 (or the compression predictor 3) can consider information from various inputs, including the QoS profile 14, the device performance profile 15, and the compression algorithm performance chart 16 to determine which compression algorithm to apply to the data.

QoS information from the QoS profile 14 may be used to determine if a given compression algorithm's performance characteristics meet the needs of the end user.

Information from the device performance profile 15 may be used to determine which compression algorithm would most effectively make use of the device resources, given the value 2 to be compressed.

Figure 2:
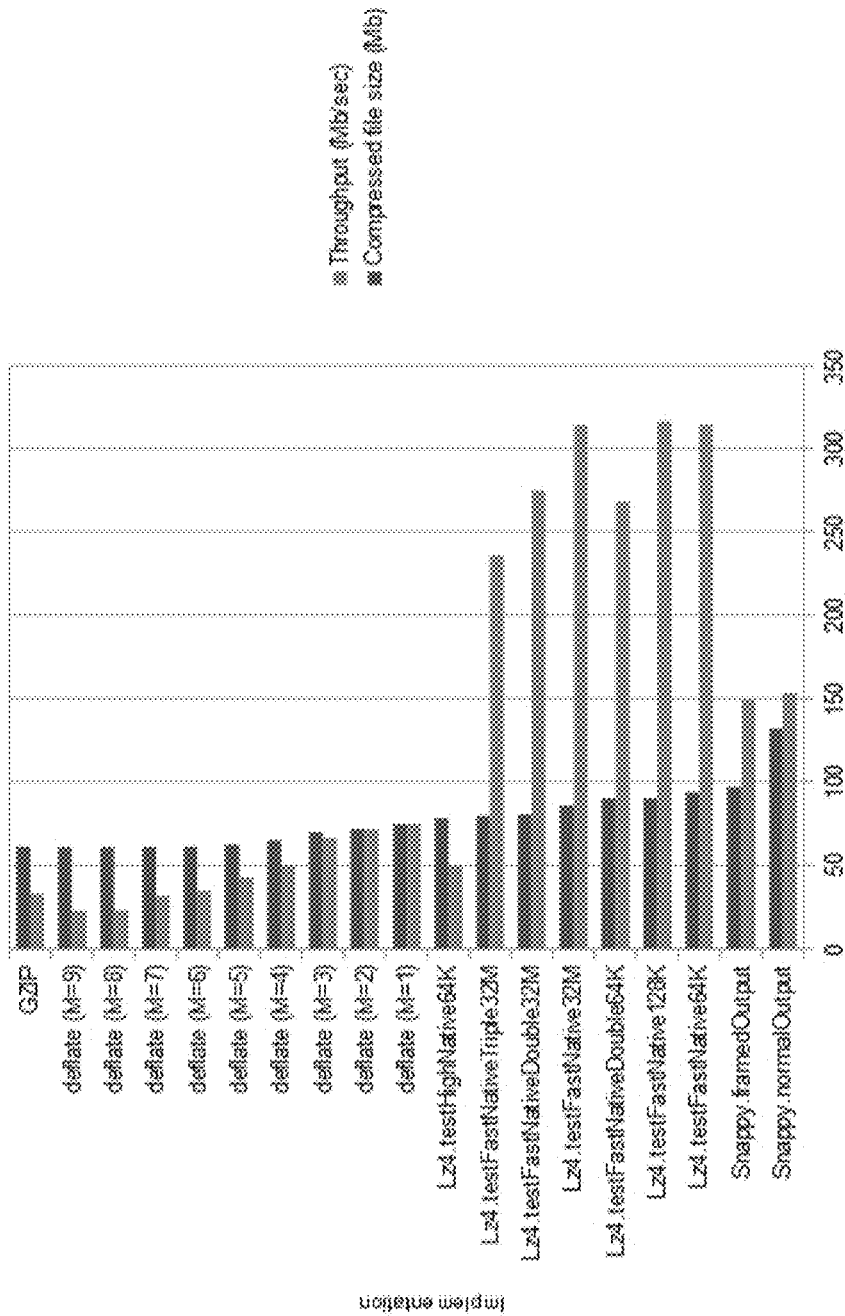
FIG. 2 is a table showing relative compression ratios of certain compression algorithms at specific throughputs.

The compression algorithm performance chart 16 contains information about a plurality of compression algorithms, including average compression ratios for each algorithm (alone or by file type), throughputs for each algorithm, and computing and memory resource requirements for each algorithm. The compression algorithm performance chart 16 allows selection of a particular algorithm based on the file type, and the available throughput (which may be determined by the QoS needs from the QoS profile 14), and the device capabilities based on the device performance profile 15. As discussed above, specific compression algorithms can provide greater compression ratios for specific data formats and thus may be preferred over other compression algorithms. In addition, as shown in FIG. 2, certain compression algorithms have better compression ratios at specific available throughputs relative to other compression algorithms. Taking into consideration information such as that contained in FIG. 2 allows the selection of a compression algorithm that optimizes the compression ratio considering current QoS and device requirements for throughput.

Therefore, depending of the current QoS needs (as provided by the QoS profile 14) and the performance capabilities of the drive 10 (as provided by the device performance profile 15), specific algorithms may be preferred over others.

By considering all these factors, the drive 10 can determine which compression algorithm to apply to the value 2 under the current conditions. Depending on the circumstances, one compression technique may be better suited for a situation than others. This embodiment takes into account the type of data to be compressed, the resources available on the drive, and user QoS requirements to dynamically assign compression algorithms to data to be compressed, so that overall performance of the SSD is optimized. This determination may result in different compression algorithms being applied to a specific value depending on the current conditions and QoS requirements. For example, if the current performance demands from other activities on the device are high, a compression algorithm may be selected that has a relatively low compression ratio so that the overall performance needs of the user are not negatively affected.

While in this embodiment, information from the QoS profile 14, the device performance profile 15, and the compression algorithm performance chart 16 are considered, in other embodiments, only some of the factors discussed above may be taken into consideration to determine the compression algorithm to be used. Further, additional information that may affect the preferred compression algorithm for a particular value may also be considered.

Once a compression algorithm is selected, a compression algorithm library 17 will provide code to the compressor 7 to initiate compression of the given value 2. The compression algorithm library 17 contains code for executing the compression algorithms. Once compression is complete, the compressed value will be outputted via the exit switch 12 to the output 13.

In some modes (especially those where compression is being done to data in-line rather than at rest, or when the instant QoS demands allow for minimal processing), an actual compression ratio achieved at one write may not be an optimal compression ratio. This may be caused by, for example, the limited space for a write buffer allocated to incoming data (such that not all data can be analyzed and compressed at once), or due to the drive being occupied with other high-value tasks, necessitating low-intensity compression.

For example, at one time, QoS requirements may demand a "quick and dirty" compression, where the data is compressed quickly, but not necessarily to its most optimal compression, to maintain the performance capabilities of the drive 10 needed by the user. In such situations, it is possible that the drive can re-compress the data more efficiently later. For example, at a later time when the disk is idle or must otherwise read and write the subject information (IE, garbage collection/wear leveling), a compressed value may be decompressed and analyzed again (using the methods above) to determine if a more optimal compression may be achieved.

In this way, for example, a stream of data that was originally compressed in-line may be more fully compressed later in an "at rest" situation.

To facilitate such re-compression, a hidden key that encodes compression information may be added to the original key. This hidden key may be ignored for normal key processing operations such as index built, search, etc., but may be accessed when compression related activities are relevant, such as when QoS demands are low. The hidden key may include information regarding the type of compression currently being used and commands to initiate recompression. The hidden key may be updated whenever a new compression scheme is applied to the value.

Figure 3:
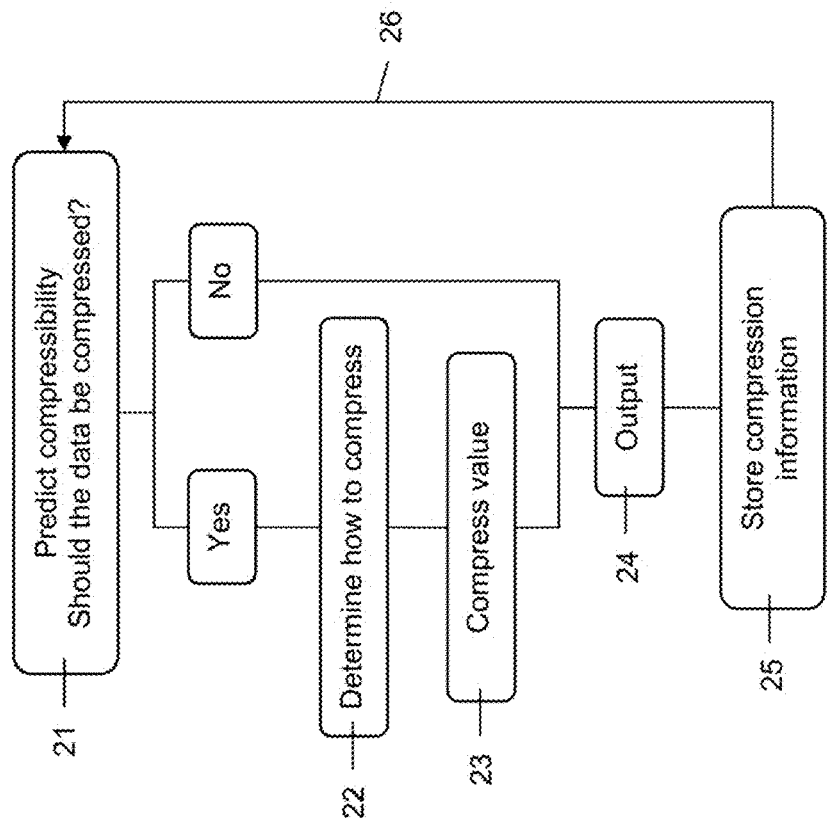
FIG. 3 is a flow chart showing the method of predicting and compressing data using the compression drive of FIG. 1.

In use, as shown in FIG. 3, the compression drive 10 first predicts 21 the compressibility of a specific key value data set using the prediction compressor 3. Predicting the compressibility of several data sets can be done individually or in parallel up to the hardware processing capabilities or limits imposed by QoS requirements. The prediction can be based on information from the file extension, file signature, entropy-based calculations, sample compressions, QoS information and/or device performance information, as discussed above with regards to FIG. 1.

For example, the onboard controller of the drive 10 or a processor on the drive 10 can search the key 1 for file extensions or signatures that may provide clues regarding compressibility. If a file extension or file signature is located, it can be analyzed and compared to information provided to the compression predictor 3 by the object extension dictionary 4 and object signature dictionary 5, respectively, to help predict the compressibility of the value 2. In other embodiments, or in cases where the file signature and file extension are not located in the key 1, the drive 10 can search the header or specific offsets of the value 2 for the file signature. If the file signature is located, it can be analyzed and compared to information provided to the compression predictor 3 by the object signature dictionary 5 to help predict the compressibility of the value 2. If neither the file extension nor the file signature is located in the key 1 or the value 2, then the drive 10 can run entropy-based calculations using information provided by the entropy estimation algorithm library 6, or the drive 10 can run sample compressions as discussed above. In some embodiments, the compression predictor 3 may also analyze information provided by the QoS profile 14 and/or the device performance profile 15 to help estimate compressibility.

The prediction may be threshold-based such that the value 2 will be compressed if it meets a specific threshold or thresholds set by the user (threshold(s) which may be designated and input by the user, or input as part of a decision table, taking into consideration any or all of above-mentioned factors relevant to predicting compressibility). For example, if the predicted compressibility is above a predetermined threshold, then the compression predictor 3 will determine that compression may go forward. If the predicted compressibility is below the predetermined threshold, then the compression predictor 3 will determine that value 2 should not be compressed.

If the compression predictor 3 determines that the value 2 should be compressed, the data is sent to the compressor 7 via the receiving switch 11. The compressor then determines 22 how to compress the value 2. In determining how to compress the value 2, the compressor 7 can consider information from various inputs, including the QoS profile 14, the device performance profile 15, and the compression algorithm performance chart 16 to determine which compression algorithm to apply to the value 2.

Once a compression algorithm is selected, the value 2 will be compressed 23 using code provided by the compression algorithm library 17 to initiate compression of the given value 2. After compression, the compressed value will be output 24 from the compressor 7 via the exit switch 12.

If the compression predictor 3 determines that the value 2 should not be compressed, the data is output 24 via the exit switch 12.

After output 24 from the compressor 7, information regarding the type of compression and commands to recompress the value 2 may be stored 25 in a hidden portion of the key 1 (i.e., the hidden key). This information may be later accessed, for example while QoS requirements are low and/or the drive 10 is at rest, to determine whether to re-compress the value 2 in order to optimize compression.

In addition, after output 24 without compression, information regarding whether to attempt to later compress the value 2 (for example, if QoS requirements prevented compression on the prior attempt) may be included. This information may include commands to attempt compression. This compression may be attempted (see arrow 26) while QoS requirements are low and/or the drive 10 is at rest.

While the above embodiment describes the compressor 7 as determining how to compress the value 2, this process can also be performed by the compression predictor 3. In determining how to compress the value 2, the compression predictor 3 can likewise consider information from various inputs, including, for example, the QoS profile 14, the device performance profile 15, and the compression algorithm performance chart 16 to determine which compression algorithm to apply to the value 2. Once the compression predictor 3 determines the compression algorithm to apply, it can output that information to the compressor 7 for compression.

While the above embodiments are described with reference to a key value drive, the process of predicting compressibility and determining how to compress the data as described above can also be used for traditional block-based drives. Because block-based drives do not include much of the metadata included in key value drives, the process will likely require more time and processing power than a key value drive.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed by appended claims and equivalents thereof.

What is claimed is:

1. A compression system on a storage drive comprising:
one or more compressibility inputs;
a compression predictor configured to predict the compressibility of data based on the one or more compressibility inputs;
a compressor configured to compress the data;
one or more compression inputs,
wherein at least one of the compression predictor or the compressor is configured to determine how to compress the data based on the one or more compression inputs.

2. The compression system of claim 1, wherein the one or more compressibility inputs comprise at least one of an object extension dictionary, an object signature dictionary, and an entropy estimation algorithm library.

3. The compression system of claim 1, wherein the one or more compression inputs comprise at least one of a quality of service profile, a device performance profile and a compression algorithm performance database.

4. The compression system of claim 1, wherein the one or more compression inputs comprises at least a quality of service profile.

5. The compression system of claim 2, wherein the compression predictor is configured to predict the compressibility of the data based on two or more compressibility inputs, and wherein the two or more compressibility inputs comprise at least two of the object extension dictionary, the object signature dictionary, the entropy estimation algorithm library, a quality of service profile and a device performance profile.

6. The compression system of claim 3, wherein the compressor is configured to determine how to compress the data based on two or more compression inputs, and wherein the two or more compression inputs comprise at least two of the quality of service profile, the device performance profile, and a compression algorithm performance chart.

7. A method of compressing data on a storage drive, the method comprising:
predicting the compressibility of data on the drive based on one or more compressibility inputs;
determining how to compress the data based on one or more compression inputs; and
compressing the data based on the determination of how to compress the data.

8. The method of claim 7, wherein the drive is a key value storage drive having a key and a value.

9. The method of claim 8, wherein the one or more compressibility inputs comprise at least one of an object extension dictionary, an object signature dictionary, and an entropy estimation algorithm library.

10. The method of claim 8, wherein the one or more compressibility inputs comprises at least an object signature dictionary.

11. The method of claim 9, wherein predicting the compressibility of the data further comprises searching the key for a file extension or a file signature.

12. The method of claim 11, wherein predicting the compressibility of the data further comprises:
locating the file extension or the file signature; and
analyzing and comparing the file extension or the file signature to information provided by the object extension dictionary or the object signature dictionary, respectively.

13. The method of claim 7, further comprising storing information regarding compression of the data in a hidden key.

14. The method of claim 13, further comprising storing commands to initiate recompression of the data in the hidden key.

15. A storage drive comprising:
a compression system on the drive comprising:
one or more compressibility inputs;
a compression predictor configured to predict the compressibility of data based on the one or more compressibility inputs;
a compressor configured to compress the data;
one or more compression inputs,
wherein at least one of the compression predictor or the compressor is configured to determine how to compress the data based on the one or more compression inputs.

16. The storage drive of claim 15, wherein the one or more compressibility inputs comprise at least one of an object extension dictionary, an object signature dictionary, and an entropy estimation algorithm library.

17. The storage drive of claim 15, wherein the one or more compressibility inputs comprises at least the object signature dictionary.

18. The storage drive of claim 15, wherein the drive is a key value storage drive.

19. The storage drive of claim 16, wherein the compression predictor is configured to predict the compressibility of the data based on two or more compressibility inputs, wherein the two or more compressibility inputs comprise at least two of the object extension dictionary, the object signature dictionary, the entropy estimation algorithm library, a quality of service profile and a device performance profile.

20. The storage drive of claim 18, wherein the one or more compression inputs comprise at least one of a quality of service profile, a device performance profile, and a compression algorithm performance chart.

* * * * *